United States Patent

Tanino et al.

[11] Patent Number: 4,499,010
[45] Date of Patent: Feb. 12, 1985

[54] CONDUCTIVE PAINT

[75] Inventors: Katsumi Tanino, Takaoka; Satoshi Fujiki, Toyama; Shinzi Okamoto, Ohwawano, all of Japan

[73] Assignees: Toyama Prefecture, Toyama; Hokuriku Electric Industry Co., Ltd., Kaminiikawa, both of Japan

[21] Appl. No.: 471,924

[22] Filed: Mar. 2, 1983

Related U.S. Application Data

[63] Continuation-in-part of Ser. No. 300,879, Sep. 11, 1981, abandoned.

[30] Foreign Application Priority Data

Sep. 19, 1980 [JP] Japan .................................. 55-129115
Nov. 5, 1980 [JP] Japan .................................. 55-154703
Jan. 29, 1981 [JP] Japan .................................. 56-10843

[51] Int. Cl.$^3$ .............................................. H01B 1/02
[52] U.S. Cl. .................................... 252/512; 106/1.13; 106/1.18; 524/338; 524/347; 524/440
[58] Field of Search ............................ 106/1.13, 1.18; 252/512; 524/347, 440, 337, 338, 73, 74

[56] References Cited

U.S. PATENT DOCUMENTS 3,968,056  7/1976  Bolon et al. ........................ 252/514
3,989,644  11/1976  Bolon et al. ........................ 252/514

Primary Examiner—Lorenzo B. Hayes
Attorney, Agent, or Firm—Jordan and Hamburg

[57] ABSTRACT

Conductive paint comprises an organic solvent having dissolved and dispersed therein a binder containing a thermosetting resin and a hydroquinone derivative which is a product resulting from reaction between a hydroquinone (polyhydric phenol) and a fatty acid having 10 to 20 carbon atoms, added to the thermosetting resin, metal powder as a conductive material, and preferably a fatty acid derived from natural oils and fats and having 10 to 20 carbon atoms. This conductive paint exhibits characteristics not inferior to those of the conventional Ag conductive paint, such as low specific resistance, high moisture resistance and high heat resistance, and is much less expensive than the conventional Ag conductive paint.

11 Claims, 3 Drawing Figures

CONDUCTIVE PAINT

REFERENCE OF COPENDING APPLICATION

This application is a continuation-in-part of our copending application Ser. No. 300,879, filed Sept. 11, 1981, now abandoned.

BACKGROUND OF THE INVENTION

1. Field of the Invention

The present invention relates to conductive paint which is inexpensive and excellent in characteristics.

2. Description of the Prior Art

As is widely known, conductive paint has heretofore been put to various applications in a variety of fields, particularly in the field of electronic appliances and parts. For example, such conductive paint has been used as jumper wires for a printed circuit wiring board, terminals of resistance formed on such printed circuit wiring board, etc.

It is the most important condition that the conductive paint, when it constitutes a part of an electrical circuit such as by printing, spraying, brush-coating, etc., has its specific surface resistance (hereinafter referred to as specific resistance) $\rho'$ of not higher than 1 $\Omega/cm^2$, preferably of 0.1 $\Omega/cm^2$. As the metals fulfilling this condition, there have been used Au, Ag, etc. generally called noble metals in the form of powder. Ag powder has been mainly used from an economical point of view and, in rare occasions, it has been used in the form of a mixture with powder of Au, Pt, etc.

Since Ag which is a component material of the conductive paint has recently become highly expensive, the cost of the conductive paint containing Ag powder has been increased by several times as much as it used to be. This increase in cost gravely affects the electronic appliances and parts industry. For this reason, various studies and researches have been conducted to date in order to obtain conductive paint by use of metals other than the noble metals in the form of powder. However, no conductive paint which can be substituted for the Ag conductive paint has yet been commercialized.

Conductive paint obtained by using Cu powder as the conductive material and, as the binder, an ordinary thermosetting resins available on the market will be outlined. When the thermosetting resins, is polycondensated to construct, generally giant resin molecules of a three-dimensional network structure, $H_2O$ is produced as the reaction product, and depending on the kind of thermosetting resin, other by-product are produced, as has widely been known to the art. In this case, a thin layer of copper oxide is formed on the surface of the Cu powder having high activity by the reaction between the by-products and heat. Since Cu powder is readily activated as the particle size thereof becomes smaller, when it is left to stand in the air, it promptly captures oxygen to form a thin layer of oxide on the surface of the Cu powder in most cases. Therefore, at the time of curing of the resin, the volume resistivity of the conductive paint becomes much higher. When metal powder other than the noble metal powder is, therefore, it has been difficult to obtain low resistance paint.

In order to obtain conductive paint having low resistance by use of metal powder other than the noble metal powder, it is deemed necessary to select a thermosetting resin which fulfills the following two conditions.

(I) It does not oxidize the metal powder even when it is stored in the form of paint, but rather has the reducing property.

(II) It absorbs oxygen to cause a polymerization or condensation reaction when paint containing the thermosetting resin is baked at a high temperature.

The condition (I) is required to avoid oxidization of metal powder contained in the conductive paint during its storage. When electrodes, cable ways, etc. are formed by printing, brush-coating, spraying, etc. using conductive paint and baked at a high temperature, the condition (II) is required to avoid oxidization of the metal powder contained in the conductive paint as coated, and to reduce a thin layer of oxide which may possibly be formed on the surface of the metal powder, so as to constitute a low resistance conductive film or layer.

The invention on the basis of the aforementioned concept is disclosed, for example, in laid-open Japanese Patent Application No. 93394/1976, and No. 115691/1976 both being entitled "Conductive Composition."

However, in these inventions, the specific resistance $\rho'$ is still high as disclosed in the specification and, therefore, it has not yet come to a point of being used as a substitution for Ag paste.

It has generally been recognized that inclusion of a reducing agent etc. either into metal powder or into a binder for the purpose of preventing the oxidization would deteriorate moisture resistance, heat resistance, etc. of the film formed upon completion of the curing reaction of the paint. Therefore, it is necessary to avoid mixing, filling, etc. of the reducing agent, with a view to preventing oxidation.

The present inventors have conducted studies on the aforementioned conditions (I) and (II) in detail and, as a result, they have found that a further condition should be added to the two conditions in order to make the specific resistance $\rho'$ lower. That is to say, they have confirmed that the conditions (I) and (II) are necessary conditions, but not sufficient conditions. On the basis of their studies, they have succeeded in obtaining conductive paint usable as a substitution for the known Ag conductive paint.

SUMMARY OF THE INVENTION

One object of the present invention is to provide conductive paint having excellent characteristics and being capable of use as a substitution for the conventional Ag conductive paint.

According to the present invention, in general aspect of it, there is provided conductive paint which comprises: (a) a binder having a hydroquinone derivative, which is a product resulting from reaction between a hydroquinone (polyhydric phenol) and a fatty acid having 10 to 20 carbon atoms, added to a thermosetting resin, (b) metal powder as an electrically conductive material, and preferably (c) a fatty acid derived from natural oils and fats and having 10 to 20 carbon atoms, all being dissolved and dispersed in an organic solvent. This conductive paint exhibits low specific resistance, high thermal resistance and a high moisture resistance.

The above and other objects and characteristic features of the present invention will become apparent from the following description which is given in detail with reference to the accompanying drawings.

DETAILED DESCRIPTION OF THE PREFERRED EMBODIMENTS

Figure 1:
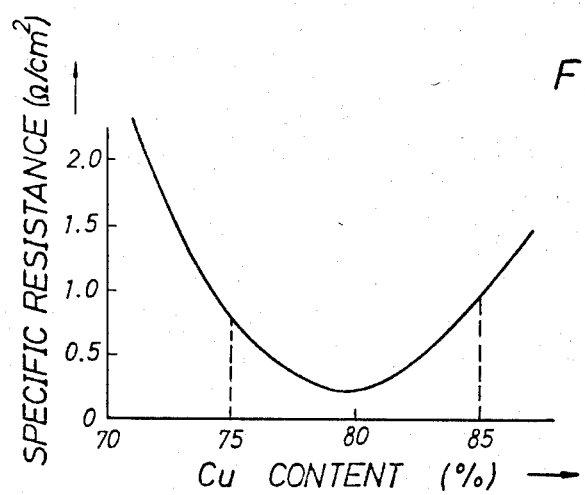
FIG. 1 is a graph showing the relation between the Cu content and the specific resistance of the conductive paint according to the present invention.

Now, the present invention will be described in detail.

First, reactions of hydroquinones (polyhydric phenols) are outlined. Hydroquinones are fundamental units in synthesizing oxidized or reduced resins of the quinone type. They are mostly in the form of colorless crystals, are easily oxidized, and are widely used as chemicals for photography, preservatives, etc. Examples of hydroquinones include (i) pyrocatechol, (ii) hydroquinone, (iii) resorcin, (iv) pyrogallol and (v) phloroglucin which are represented by the following general formulas respectively.

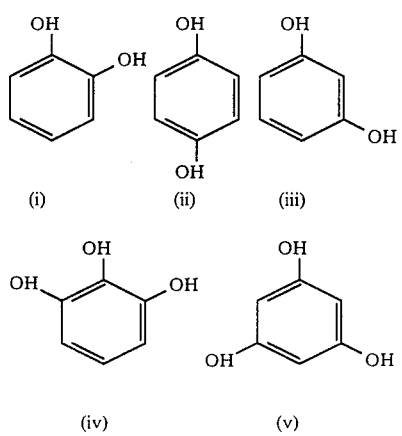

These hydroquinones exhibit a reversible reaction between oxidization and reduction. Generally, hydroquinones and oxidized or reduced resins of the quinone type are used in some case as inhibiting agents for radical and ionization reactions of monomers of other high molecular resins to prevent polymerization of such other high molecular resins. Accordingly, when hydroquinones are added to other high molecular resins, the curing reaction of the resins can be prevented. The reaction between hydroquinone and a high molecular resin will be described by citing pyrocatechol as one example of the hydroquinone.

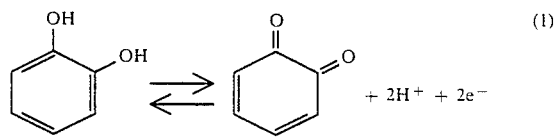

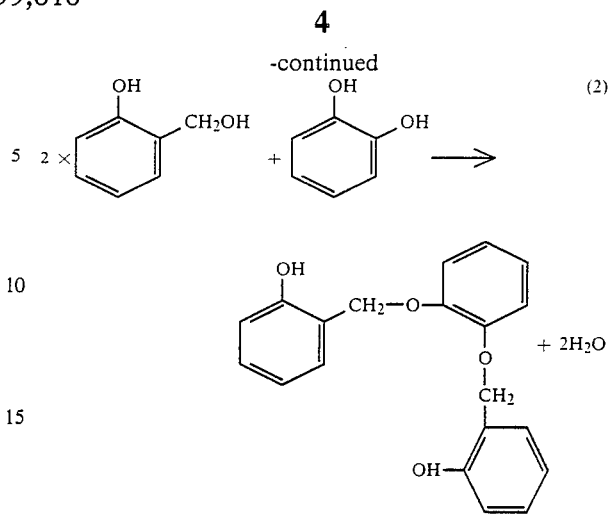

The equation (1) above shows the reversible reaction of pyrocatechol between oxidization and reduction. The equation (2) above shows one example of the reaction between a resol resin (a phenolic resin) and pyrocatechol. As is clear from the equation (2), no giant molecules of a three-dimensional network structure are formed. In this case, the equation (2) is equally applicable to the reaction between pyrocatechol and other resin. Generally, reactions between hydroquinones and other resins cause the radical polymerization etc. with the resin to proceed in a chain reaction, unless a separate functional group is added thereto, with the consequence that no giant three-dimensional molecular structure is formed.

The present inventors have discovered, during their studies on the physico-chemical properties of hydroquinones, that a mere heating reaction of a mixture of a special hydroquinone derivative and such other resins forms giant molecules of a three-dimensional network structure without addition of the above mentioned separate functional group, i.e. such heating can sufficiently complete the poly-condensation reaction. The present invention has been accomplished on the basis of this discovery.

In the following, explanations will be given as to the above-mentioned reaction with pyrocatechol as one example of hydroquinones.

(A) A pyrocatechol derivative is manufactured by dispersing in a solution of saturated or unsaturated fatty acid having 10 to 20 carbon atoms pyrocatechol together with Cu salt of an organic fatty acid and/or fine Cu powder, and causing these components to react in the presence of Cu ions to be produced at the time of the dispersion as catalysts. The pyrocatechol derivative thus obtained is considered to have the following structural formula:

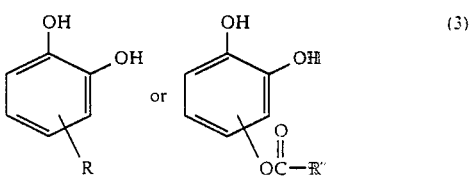

wherein, R and R' each denote a saturated or unsaturated mono-aliphatic radical having nine or more carbon atoms.

(B) In the following, explanations will be given as to a case, wherein the aforementioned pyrocatechol derivative is dissolved in a phenolic resin, i.e. a resol type resin, for example, and the solution is heated to cause the reaction to proceed as represented by the following equation:

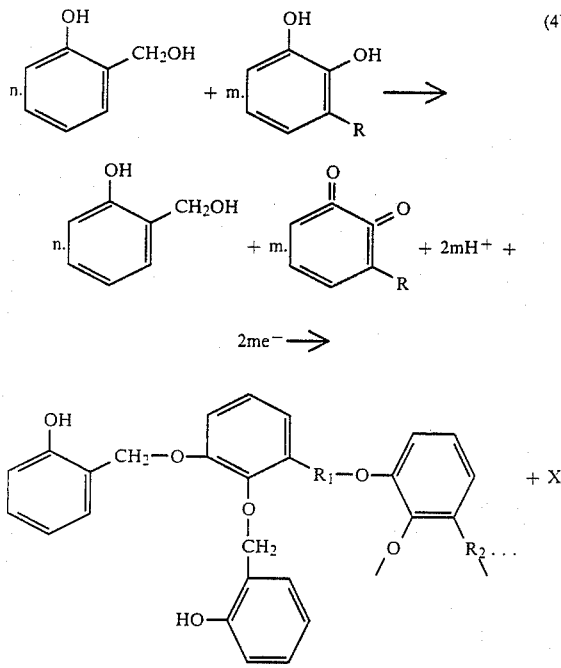

wherein, n and m denote arbitrary integers respectively, and X denotes H$_2$O in most cases. As the result, giant molecules of a three-dimensional network structure are formed.

The reaction shown in the above equation (4) takes place also when epoxy resins or melamine resins are used in place of the aforementioned phenolic resin. The similar reaction to the above takes place when other hydroquinone derivatives are used. The derivatives having reaction groups other than the OH group or those having such reaction groups added thereto bring about polycondensation with other resins, to form the result that giant molecules of a three-dimensional structure. Thus far, formation of the giant molecules by reaction of hydroquinone derivatives with other resins followed by thermosetting thereof as has been described above.

The characteristic features of the conductive paint obtained by using a mixture of a thermosetting resin and the aforementioned pyrocatechol derivative as a binder and Cu powder as an electric conductor will be described. Since conductive paint excellent in characteristics cannot be obtained by using resins to be set at a normal temperature, the aforementioned thermosetting resins are required to have a curing temperature of not less than 110° C.

(a) An oxygen absorbing reaction at high temperature occurs suddenly.

As the result of the thermogravimetric analysis and the differential thermal analysis, pyrocatechol derivatives are converted suddenly into quinones when the ambient temperature reaches 115° C. or higher and absorb a large quantity of oxygen from the atmosphere as represented by the following equation:

$$n \cdot \underset{R}{\underset{|}{\text{catechol}}}\text{-OH, OH} + \tfrac{1}{2}n \cdot O_2 \longrightarrow n \cdot \underset{R}{\underset{|}{\text{quinone}}} + n H_2O \uparrow \qquad (5)$$

wherein, n denotes an arbitrary integer. On the other hand, as shown in the equation (4), quinones of this kind reacts with the thermosetting resin to cause the radical polymerization to proceed, thereby forming a very fine layer of high molecular resin on the surface of the conductive paint film. In the reaction shown in the equation (5), if a thin layer of oxide has been formed on the surface of Cu powder, it is reduced simultaneously and the Cu powder is coated with a fine film after the conductive paint has been cured thereby ceasing the oxidization reaction to proceed further.

(b) Cu powder is not oxidized by heating to high temperature.

Cu powder (having a particle size of less than 10 μm) begins to be oxidized at 160° C. and, at 235° C., the oxidization reaction extends to the interior of the Cu powder. This oxidization reaction of Cu is an exothermic phenomenon. In other words, the activation energy is positive. On the other hand, when a pyrocatechol derivative is added to a thermosetting resin followed by heating the resultant mixture, it begins to cure at 110° C. and is completes the curing reaction at a temperature in the range of from 170° C. to 180° C. This curing reaction is an endothermic phenomenon. That is to say, the activation energy in this case is negative. For these reasons, in the resin having Cu powder dispersed therein, the activation energy of Cu is absorbed as the energy for curing the resin, even when the curing temperature is increased to higher than 160° C. with the consequence that the oxidizing reaction is obstructed, and no Cu$_2$O can be formed. This means that Cu powder is not oxidized even at a high temperature. Even if the temperature is further increased, the surface of the resin as the binder has already been cured and a very fine film has been formed on the surface of the resin to stop the absorption of oxygen. Therefore, the oxidizing reaction of Cu does not proceed further.

(c) Strong reducibility is exhibited by heating to high temperature.

As mentioned in the foregoing, when the thermosetting resin having the pyrocatechol derivative added thereto reaches a high temperature level, the surface of the resin is cured to form a very fine film thereon, thereby making it considerably difficult for oxygen to permeate the film, with the result that the interior of the resin is brought to a state of lack of oxygen. Therefore, in order to proceed with the curing reaction, the activated pyrocatechol derivative absorbs the oxygen in the thin layer of oxide formed on the surface of the Cu powder so as to complete the polycondensation reaction with the thermosetting resin. On account of this, the layer of oxide on the surface of the Cu powder is reduced, and the electric conductivity of the Cu powder is improved.

(d) Pyrocatechol derivatives are easily dissolved in various organic solvents.

Since the pyrocatechol derivative has OH groups as exemplified by the structural formula (3), it can easily be dissolved in various organic solvents. On the other hand, since the pyrocatechol derivative as a single substance does not bring about the polycondensation reaction, a paint composition of excellent characteristics can be obtained by combining the pyrocatechol derivative with other thermosetting resins. The paint does in no case bring about the structural deterioration thereof during its storage.

(e) The conductive paint during its storage does not deteriorate its characteristics.

If intrusion of moisture is intercepted, the conductive paint will have a pot life of more than one year. Generally, since the pyrocatechol derivative is not converted into quinone at a normal temperature, when it is added to the thermosetting resin as a binder for the conductive paint, no curing reaction takes place.

However, since there is a possibility of the thermosetting resin cutting off its molecular chains by the OH groups in the atmosphere of high humidity, it is desirable that moisture permeation be completely intercepted during a long period of storage of the paint.

(f) The contact resistance of the metal powder is made low by the curing reaction.

Since the layer of oxide formed on the surface of the metal powder is reduced at the time of the curing reaction at an elevated temperature, as described in the item (c) above, the contact resistance of the metal powder becomes low.

Further, the thermosetting resin with the pyrocatechol derivative added thereto, produces an extremely characteristic effect at the time of its curing. To be more specific, in case the giant molecules of a three-dimensional network structure are formed when the resin is cured, the cured molecules constitute a fine and rigid structure having orientation of the spherical molecules of a particle diameter ranging from 0.2 $\mu$m to 50 $\mu$m. On account of this, metal powder with which to fill the spaces among the molecules is firmly fastened to the molecules, thereby increasing the contact area between the respective binders, with the result that the electric conductivity of the metal powder is much more enhanced. This is considered to be the satisfying condition (i.e., the condition (III) for obtaining the conductive paint excellent in its conductive characteristics in addition to the aforementioned necessary conditions (I) and (II).

As the thermosetting resins usable for the conductive paint according to the present invention, there may be used any kind of known resins for electrical appliances, such as phenolic resins, epoxy resins, melamine resins, etc. Of these known resins, epoxy-melamine type resins are preferable from the aspects of both moisture resistance and thermal resistance. Examples of the epoxy resins, one of the components of the epoxy-melamine type resins, include Epikote 801 to Epikote 1007 (molecular weight: 330 to 2900), and examples of the melamine resin, the other component of the epoxy-melamine type resins include methylolmelamine and alkylated methylolmelamine (such as methylated methylolmelamine, ethylated methylolmelamine and butylated methylolmelamine type, for example). These epoxy-melamine resins are widely used as a coating material for a printed circuit wiring board. Further, the content of the melamine resin is in the range of from 20% to 80% by weight with respect to the total weight of the epoxy resin and the melamine.

Any hydroquinone derivative obtained by reacting hydroquinones represented by the following formula:

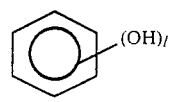

(wherein 1 denotes an integer of 2 or 3) and as enumerated in (i) to (v) above with saturated or unsaturated fatty acids having 10 to 20 carbon atoms, such as palmitic acid, oleic acid, linoleic acid, linolenic acid, etc. can be used for the purpose of the present invention. 30 to 70 parts by weight of the hydroquinone derivative per 100 parts by weight of the thermosetting resin can be used in the present invention. If the amount of the derivative falls outside this range, the paint to be obtained exhibits high specific resistance and low to moisture resistance.

Any kind of metals in the form of powder may be used as the conductor for the purpose of the present invention provided that they are of low resistivity. Of these metals, Cu, Ni, Cr and Mo are preferably used. The average particle diameter of the metal powder used in the present invention is preferably around 10 $\mu$m. A favorable specific resistivity can be exhibited with the content of metal powder of from 75% to 85% based on the following equation:

$$f(\%) = \frac{m}{\gamma \& m} \times 100$$

(where: f(%) denotes the contents of the metal powder; $\gamma$ represents a weight of the thermosetting resin; and m indicates a weight of the metal powder.

The organic solvents usable for the conductive paint of the present invention play a role of uniformly dispersing the hydroquinone derivative and Cu powder in the resin and of effecting the viscosity adjustment. Examples of such organic solvents include ethyl acetate, acetone, turpentine oil, methyl ethyl ketone, ethyl carbitol and butyl carbitol.

Now, fatty acids derived from natural oils and fats, usable in the present invention, will be described in detail.

When a small amount of a fatty acid is added to the conductive paint using both hydroquinone derivative, the resin molecules and metal powder in the conductive paint are coated with the fatty acid. Owing to this, when a thin film of paint is formed by printing, brush coating or spraying of the conductive paint and is baked at a temperature in the range of from 110° C. to 170° C., another extremely thin film is formed on this thin film. Similarly, the surfaces of the resin molecules and the metal powder in the film are also coated with thin film of the fatty acid. The composite film structure thus formed makes it difficult for the water molecules to penetrate thereinto even in the atmosphere of high humidity. It will be understood from this fact that the moisture resisting property is considerably enhanced, the effect of which is conspicuous as will be described later. By the addition of a small amount of a fatty acid derived from natural oils and fats, the specific resistance can be remarkably decreased as will be apparent from the ensuing examples. Furthermore, the fatty acid derived from natural oils and fats, when added to conductive paint to be produced, serves to prevent the Cu powder in the conductive paint from being oxidized during the preservation of the conductive paint.

As is clear from the explanation given above, however, the thin film of the fatty acid formed on the surfaces of the resin molecules and the metal powder is insulative and has high insulation resistance. Therefore, the larger the thickness of the fatty acid film becomes, the greater is the specific resistance of the conductive paint. For these reasons, the amount of the fatty acid to be added is required to be as small as possible, to such an extent that is capable of improving the moisture resisting property.

The adding quantity of a fatty acid derived from natural oils and fats may preferably be in a range of from 0 to 8% based on the following equation:

$$g(\%) = \frac{n}{\gamma + h + m + n} \times 100$$

(where: $g(\%)$ denotes the adding ratio of the fatty acid belonging to natural oils and fats; $\gamma$ represents a weight of the thermosetting resin; $h$ indicates a weight of the hydroquinone derivative; $m$ refers to a weight of the metal powder; and $n$ designates a weight of a fatty acid derived from natural oils and fats. The optimal amount of the fatty acid is determined in consideration of the balance between the specific resistance and the moisture resisting property.

Examples of the fatty acids derived from natural oils and fats usable for the purpose of the present invention include oleic acid, linoleic acid, linolenic acid and stearic acid. Of these fatty acids, oleic acid, linoleic acid and linolenic acid exhibit particularly advantageous result because, as described afterwards, addition of these fatty acids has the effect of remarkably lowering the resistance value, and of considerably improving the humidity resisting property. On the other hand, saturated fatty acids such as stearic acid has the effect of decreasing the resistance value, but they do not so much improve the moisture resisting property. Fatty acids having less than 10 carbon atoms are not desirable in maintaining favorable working environment because they give out an unpleasant stimulative smell and do not bring about good effects from the aspects of the resistivity and moisture resisting property.

This invention will be described in more detail with reference to several Reference Examples and Working Examples.

REFERENCE EXAMPLE 1

A saturated pyrocatechol derivative was prepared by the following procedures.

50 g of palmitic acid was dissolved in ethyl alcohol heated to a temperature of 40° C. Subsequently 20 g of pyrocatechol, 0.1 to 0.5 g of copper acetate and 0.5 to 20 g of fine Cu powder were mixed with the resultant solution, and the mixture held at 40° C. was stirred for about three hours by use of an automatic stirring device whereupon a pyrocatechol derivative is derived from pyrocatechol and palmitic acid by the catalytic action of the Cu ions isolated from the copper acetate Cu(CH$_3$COO)$_2$.H$_2$O and the Cu powder. The pyrocatechol derivative thus produced in the mixture was separated by removing the Cu powder through filtration, distilling off ethanol, then adding ethyl ether to the residual substance, and washing the ether layer with aqueous solution of sodium carbonate and water followed by distilling off of ether, whereupon the pyrocatechol derivative in dark brown crystal was obtained.

This crystal was examined for its structure by use of an infrared spectrometer and a nuclear magnetic resonance device. As a result, it was presumed that the crystal was represented by the following structural formula:

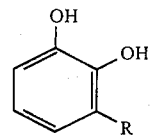

wherein, R denotes —(CH$_2$)$_{14}$—CH$_3$ or —COO—(CH$_2$)$_{14}$—CH$_3$ (6),(7).

This R is determined depending on the reaction conditions.

REFERENCE EXAMPLE 2

A mixture composed of 100 cc of ethyl acetate, 20 g of pyrocatechol, 25 g of oleic acid, 25 g of copper oleate and 0.5 to 20 g of fine copper powder was treated at a room temperature (20° C.) by the same procedures as in REFERENCE EXAMPLE 1. In the resultant solution, there was produced a pyrocatechol derivative having an unsaturated side chain. The pyrocatechol derivative was then separated by the same procedures as in REFERENCE EXAMPLE 1 to obtain a dark brown crystal of pyrocatechol derivative. This crystal was examined for its structure in the same manner as in REFERENCE EXAMPLE 1. As a result, it was presumed that the crystal was represented by the following structural formula:

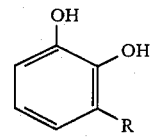

wherein, R denotes —(CH$_2$)$_7$—CH=CH—(CH$_2$)$_5$—CH$_3$ or —(CH$_2$)$_7$—CH=CH—(CH$_2$)$_7$—CH$_3$ or —CO$_2$—(CH$_2$)$_7$—CH=CH—(CH$_2$)$_7$—CH$_3$ (8),(9),(10).

This R is determined depending on the reaction conditions.

WORKING EXAMPLE 1

The pyrocatechol derivative obtained in REFERENCE EXAMPLE 2, was added to an epoxy-melamine type resin, which is excellent in moisture resistance and heat resistance and is composed of 30% by weight of a paint material having soybean oil fatty acid of Epikote 1004 (molecular weight: about 1800) esterified and 70% by weight of ethylated methylolmelamine (average molecular weight: about 650), at a rate of 60 parts by weight with respect to 100 parts by weight of pure resin component. By dispersing Cu powder having a particle size of about 10 μm in the resultant mixture and further adding diethylene glycol mono-n-butyl ether as a solvent thereto, there was obtained conductive paint suitable for use in screen printing.

By use of the conductive paint, a zigzag pattern of 50 μm in thickness, 2 mm in width and 372 mm in length was printed through a nylon screen on a PC board (a phenolic laminate) with a Cu electrode having been formed by the chemical etching. The printed zigzag pattern of the paint coating was baked and cured in an isothermal vessel at 160° C. for 30 minutes. A resistance value of the sample thus obtained was measured and its specific resistance $\rho'$ ($\Omega/cm^2$) was calculated from the value of the measured resistance. The results are as shown in FIG. 1.

In FIG. 1, the axis of ordinate denotes the specific resistance and the axis of absicca represents the Cu content f (%). The Cu content is given by the following equation:

$$f = \frac{m}{\gamma \& m} \times 100\%$$

(where: $\gamma$ denotes an amount of pure resin component in the paint; and m is a weight of Cu powder).

It will be understood from FIG. 1 that the specific resistance $\rho'$ indicates the minimum value of 0.2 $\Omega/cm^2$ when the Cu content is in the neighborhood of 80% and that the conductive paint can sufficiently be used if the Cu content falls in the range of from 74% to 86%.

Ten test samples identical with the sample described above were introduced into an isothermal vessel maintained at 100° C. for the purpose of effecting a thermal heat resistance test. The results are shown in FIG. 2.

Figure 2:
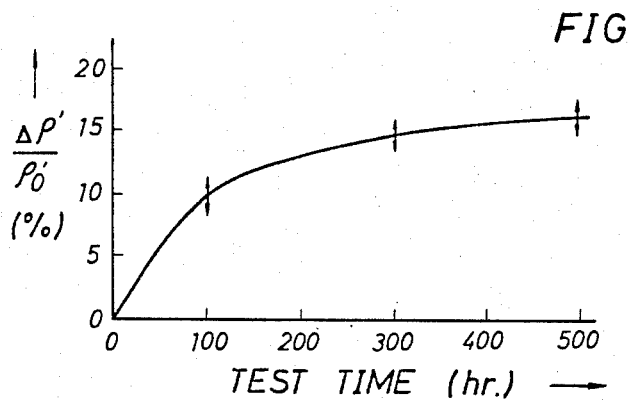
FIG. 2 is a graph showing the thermal resistance characteristic of a printed conductor by use of the Cu conductive paint according to the present.

In FIG. 2, $\rho'_o$ denotes an initial specific resistance and $\Delta\rho'$ denotes variations obtained by subtracting the initial specific resistance from the specific resistance $\rho'_o$ measured after start of the test. The curve in FIG. 2 is obtained by connecting the average values of the variation rates $\Delta\rho'/\rho'_o$ and the arrows in FIG. 2 indicates a range of fluctuation in resistivity.

Printing was then effected on a Bakelite laminate by use of the conductive paint and the printed conductive paint was sufficiently cured to obtain a conductor. The conductor was introduced into an isothermal vessel kept at a temperature of 60° C. and relative humidity of 95%, and a relationship between the time and the resistance variation rate $\delta R$ was measured. The results are as represented by the curve (A) in FIG. 3. The variation rate of resistance $\delta R$ was calculated by the following equation:

$$\delta R = \frac{R_t - R_0}{R_0} \times 100\% \quad (12)$$

(where $R_0$ denotes resistance of the conductor; and $R_t$ represents a resistance value at the time of measurement). As is clear from the curve (A) in FIG. 3, the conductive paint exhibite insufficient moisture resisting property.

Six samples were prepared by using Ag, Ni, Cr, Ta, Mo and Pb powder having a particle size of around 10 $\mu$m in place of the Cu powder. The samples were tested for specific resistance. The results are as shown in Table 1 below.

TABLE 1

| Sample No. | Metal Powder | Specific Resistance $\rho'(\Omega/cm^2)$ |
| --- | --- | --- |
| 1 | Ag | 0.09 |
| 2 | Ni | 0.448 |
| 3 | Cr | 0.54 |
| 4 | Ta | 6.48 |
| 5 | Mo | 1.21 |
| 6 | Pb | $2 \times 10^5$ |

As is clear from Table 1 above, besides Ag powder, Ni, Cr and Mo powder would be considered usable as a component for the conductive paint, as the case may be.

WORKING EXAMPLE 2

The same pyrocatechol derivative as that obtained in REFERENCE EXAMPLE 2 was added to an epoxymelamine type resin, which is excellent in moisture resistance and heat resistance and is composed of 30% by weight of a paint material having soybean oil fatty acid of Epikote 1004 (molecular weight: about 1800) esterified and 70% by weight of ethylated methylolmelamine (average molecular weight: about 650), at a rate of 60 parts by weight with respect to 100 parts by weight of the pure resin component. The resultant product will hereinafter referred to as EM resin.

Paint suitable for screen printing, composed of 16% by weight of EM resin, 80% by weight of fine Cu powder and 4% by weight of oleic acid $C_{17}H_{33}COOH$, was prepared by dissolving the EM resin in diethylene glycol mono-n-butyl ether as a solvent, dispersing Cu powder having a particle size of about 10 $\mu$m in the solution, adding oleic acid to the dispersion and uniformly mixing all components. By use of the conductive paint, a zigzag pattern of a film having 50 $\mu$m in thickness, 2 mm in width and 372 mm in length was printed through a nylon screen on a PC board (a phenolic laminate) with a thin film electrode of copper having been formed thereon by the chemical etching. The printed zigzag pattern was baked and cured in an isothermal vessel kept at 160° C. for 30 minutes to obtain ten samples of conductive paint for use in printing. These ten samples were measured for their resistance values. The average resistance value of the samples was 3.82 $\Omega$ and the fluctuation in the resistance value was very small. Therefore, the specific resistance $\overline{\rho}'$ (average) was 0.021 $\Omega/cm^2$ which was calculated by $3.82 \times 2/372$. This specific resistance value is comparable with that of the conventional Ag paint.

The ten samples were measured for moisture in the same manner as in WORKING EXAMPLE 1, and the resistance variation rate of $\delta R$ was obtained from the equation (12) above. The results are as shown by the curve (B) in FIG. 3. The fluctuations in the resistance values of the ten samples were also very small.

Figure 3:
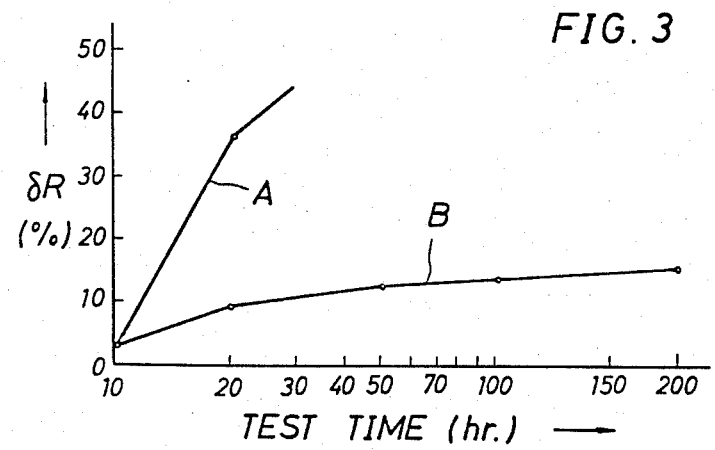
FIG. 3 illustrates graph showing the moisture resistance characteristic of a printed conductor, with the Cu conductive paint according to the present invention.

It will be seen from FIG. 3 that the characteristics in this WORKING EXAMPLE are further improved.

When the content of EM resin is fixed at 16% by weight, the content of oleic acid may be used in the range of from 2% to 8% by weight. The content of the oleic acid used in this WORKING EXAMPLE i.e. 4% by weight is an intermediate value of the range capable of giving the minimum specific resistance $\rho'$.

WORKING EXAMPLE 3

16% by weight of EM resin, 80% by weight of fine Cu powder and 4% by weight of linoleic acid $C_{17}H_{31}COOH$ were treated by the same procedures as in WORKING EXAMPLE 2 to obtain conductive paint. Ten samples were prepared in the same manner as in WORKING EXAMPLE 2. The specific resistance $\rho'$ was obtained from the resistance values of the ten samples The average specific resistance $\overline{\rho}'$ was 0.023 $\Omega/cm^2$, which is comparable with that of the conventional Ag paint. The fluctuations in the resistance values were small.

These ten samples were treated for moisture resistance under the same conditions as those in WORKING EXAMPLE 2. the resistance variation rate $\delta R$ upon lapse of 200 hours was 11% to 13% which was substantially the same as that in WORKING EXAMPLE 2.

The range of the content of linoleic acid and the intermediate value of the range capable of giving the minimum specific resistance $\rho'$ are substantially the same as that in WORKING EXAMPLE 2 using oleic acid.

WORKING EXAMPLE 4

16% by weight of EM resin, 80% by weight of fine Cu powder and 4% by weight of linolenic acid $C_{17}H_{29}COOH$ were treated in the exactly same procedures as in WORKING EXAMPLE 2 to obtain conductive paint. Ten samples were prepared in the same manner as in WORKING EXAMPLE 2. The specific resistance $\rho'$ was obtained from the resistance values of the ten samples. The average specific resistance $\overline{\rho}'$ was 0.019 $\Omega/cm^2$, which is comparable with that of the known Ag paint. Further, the fluctuations in the resistance values were small.

These ten samples were measured for moisture resistance under the same conditions as those in WORKING EXAMPLE 2. The resistance variation rate $\delta R$ upon lapse of 200 hours was 11% to 13% which was substantially the same as in WORKING EXAMPLE 2.

According to the present invention, as described above, there can be provided conductive paint which is highly excellent in characteristics and much less expensive than the conventional Ag conductive paint by making up the conductive paint with a binder composed of a hydroquinone derivative and a thermosetting resin, a metal powder as a conductor and, preferably, a small amount of a fatty acid derived from natural oils and fats, all being dissolved and dispersed in an organic solvent. Thus, the present invention contributes greatly to this field of art.

What is claimed is:

1. A conductive paint comprising an organic solvent, a binder composition comprising a thermosetting resin and a hydroquinone derivative obtained by reacting a hydroquinone represented by the formula:

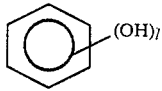

wherein, l denotes an integer of 2 or 3, with one member selected from the group consisting of saturated fatty acids having 10 to 20 carbon atoms and unsaturated fatty acids having 10 to 20 carbon atoms in the presence of a catalytic amount of at least one member selected from the group consisting of copper salts of organic fatty acids and fine copper powder, and an electrically conductive metal powder.

2. The conductive paint according to claim 1, wherein said unsaturated fatty acids have a double bond.

3. The conductive paint according to claim 1, wherein the saturated fatty acids and unsaturated fatty acids have 16 to 18 carbon atoms.

4. The conductive paint according to claim 1, wherein said electrically conductive metal powder is copper powder.

5. The conductive paint according to claim 1, wherein the reaction for obtaining said hydroquinone derivative is effected in said organic solvent in the presence of said copper salts of organic fatty acid and said fine copper powder.

6. The conductive paint according to claim 1, wherein said one member selected from the group consisting of saturated fatty acids and unsaturated fatty acids is a member selected from the group consisting of palmitic acid and oleic acid.

7. The conductive paint according to claim 1, wherein said thermosetting resin is an epoxy-melamine resin.

8. The conductive paint according to claim 1, wherein said thermosetting resin has a hardening point of at least 110° C., said hydroquinone derivative is added so that the weight ratio thereof, relative to the weight of said thermosetting resin, is in the range of from 0.3 to 0.7, and said electrically conductive metal powder is added so that the weight ratio thereof, relative to the sum of the weights of said thermosetting resin and said conductive metal powder is in the range of from 0.75 to 0.85.

9. The conductive paint according to claim 1, further comprising a small amount of a fatty acid derived from natural oils and fats.

10. The conductive paint according to claim 8, wherein said fatty acid derived from natural oils and fats is one member selected from the group consisting of oleic acid, linoleic acid and linolenic acid.

11. The conductive paint according to claim 9, wherein said thermosetting resin has a hardening point of at least 110° C., said hydroquinone derivative is added so that the weight ratio thereof, relative to the weight of said thermosetting resin is in the range of from 0.3 to 0.7, said conductive metal powder is added so that the weight ratio thereof, relative to the sum of the weights of said thermosetting resin and said conductive metal powder is in the range of from 0.75 to 0.85, and said fatty acid derived from natural oils and fats is added so that the weight ratio thereof, relative to the sum of the weights of said thermosetting resin, said hydroquinone derivative, said conductive metal powder and said fatty acid is in the range of from 0 to 0.08.

* * * * *